US006825559B2

(12) United States Patent
Mishra et al.

(10) Patent No.: US 6,825,559 B2
(45) Date of Patent: Nov. 30, 2004

(54) GROUP III NITRIDE BASED FLIP-CHIP INTERGRATED CIRCUIT AND METHOD FOR FABRICATING

(75) Inventors: Umesh K. Mishra, Santa Barbara, CA (US); Primit Parikh, Goleta, CA (US); Yifeng Wu, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/335,915

(22) Filed: Jan. 2, 2003

(65) Prior Publication Data

US 2004/0130037 A1 Jul. 8, 2004

(51) Int. Cl.[7] ........................ H01L 29/00; H01L 23/34; H01L 23/48; H01L 23/52; H01L 29/40
(52) U.S. Cl. ...................... 257/728; 257/744; 257/532; 257/533
(58) Field of Search ................... 257/758–773, 257/728, 744, 532–533

(56) References Cited

U.S. PATENT DOCUMENTS

| | | | |
|---|---|---|---|
| 5,192,987 A | 3/1993 | Khan et al. | 257/183.1 |
| 5,949,140 A | * 9/1999 | Nishi et al. | 257/728 |

FOREIGN PATENT DOCUMENTS

| | | |
|---|---|---|
| EP | 0938139 A | 8/1999 |
| GB | 2136203 A | 9/1984 |

OTHER PUBLICATIONS

Gaska et al. High–Temperature Performance of AlGaN/GaN HFETs On SiC Substrates, IEE Electron Device Letters, vol. 18, No. 10, Oct. 1997, p. 492–494.
Wu et al., High Al Content AlGaN/GaN HEMTs With Very High Performance, IEDM–1999, Digest, Dec. 1999, pp. 925–927, Washington, D.C.
Lu et al., AlGaN/GaN HEMTs On SiC With Over 100GHz Ft and Low Microwave Noise, IEEE Transactions On Electron Devices, vol. 48, No. 3, Mar. 2001, p. 581–585.
Wu et al., Bias–Dependent Performance of High–Power AlGaN/GaN HEMTs, IEEE, 2001.
CRC Press "The Electrical Engineering Handbook", 2nd Edition, DORP, p. 994, (1997).
Wu Y–F et al, "Very–High Power Density AlGaN/GaN HEMTS", IEEE Transactions On Electron Devices, IEEE Inc. New York, US, vol. 48, No. 3, Mar. 2001, pp. 586–590, XP001039003. Section II "Device Technology", p. 586, Section III "Device Performance", p. 588, right column.
Wu Y–F et al, "14–W GaN–Based Microwave Power Amplifiers" Microwave Symposium Digest, 2000 IEEE MTT–S International Boston, MA, USA Jun. 11–16, 2000, pp.963–965, XP010507496, ISBN: 0–7803–5687–X, Section II "Device Technology", Section III "Circuit Design and Fabrication", p. 963–964.
Publication, US 2002/017727 A1, (Uemura Toshiya), Feb. 14, 2002.
Publication U.S. 2001/023964 A1 (Wu Yifeng et al, Sep. 27, 2001.
J.J. Wierer et al., "High–Power AlGaInN Flip–Chip Light Emitting Diodes", Applied Physics Letters, vol. 78, No. 22, May 28, 2001, p. 3379–3381, XP002280202, p. 3380, left–hand column, fig. 1A, 1B.

(List continued on next page.)

Primary Examiner—Cuong Nguyen
(74) Attorney, Agent, or Firm—Koppel, Jacobs, Patrick & Heybl

(57) ABSTRACT

A flip-chip integrated circuit includes a circuit substrate having electronic components. The circuit substrate typically includes GaAs or Si. Another substrate can include Group III nitride based active semiconductor devices. This substrate typically includes SiC and can be separated to provide individual nitride devices. After separation, one or more of the Group III devices can be flip-chip mounted onto the circuit substrate. The electronic components on the circuit substrate can be coupled to the nitride devices using conductive interconnects and/or vias.

18 Claims, 7 Drawing Sheets

OTHER PUBLICATIONS

Nguyen N X et al., "GaN/AlGaN Modfet With 80 GHz FMAXAND>100v Gate–Drain Breakdown Voltage" Electronics, IEE Stevenage, GB, vol.33, No. 4, Feb. 13, 1997, pp. 334–335, XP006007044, ISBN; 0013–5194, p. 332, left–hand Fig. 1.

Wu Y–F et al., "GAN–Based FETS for Microwave Power Amplification" IEICE Transactions on Electronics, Institute of Electronics Information and Comm. Eng. Tokyo, JP, vol. B82–C, No. 11, Nov. 1999, p. 1895–1905, XP000931553.

Xu J J et al, "A 3–10 GHz LCR–Matched Power Amplifier Using Flip–Chip Mounted AlGaN/GaN HEMTs" Microwave Symposium Digest, 2000 IEEE, MTT–S International Boston, MA, USA Jun. 11–16, 2000, Piscataway, NJ, USA, IEEE, US Jun. 11, 2000, p. 959–962, XP01057495.

* cited by examiner

GROUP III NITRIDE BASED FLIP-CHIP INTERGRATED CIRCUIT AND METHOD FOR FABRICATING

BACKGROUND OF THE INVENTION

1. Field of the Invention

This invention relates to nitride based semiconductor devices, and more particularly to nitride based power devices that are flip-chip mounted on circuit substrates having passive components and/or pre-stage amplifiers.

2. Description of the Related Art

Microwave systems commonly use solid state transistors as amplifiers and oscillators, which has resulted in significantly reduced system size and increased reliability. To accommodate the expanding number of microwave systems, there is an interest in increasing their operating frequency and power. Higher frequency signals can carry more information (bandwidth), allow for smaller antennas with very high gain, and provide radar with improved resolution.

Field effect transistors (FETs) and high electron mobility transistors (HEMTs) are common solid state transistors that can be fabricated from semiconductor materials such as Silicon (Si) or Gallium Arsenide (GaAs). One disadvantage of Si is that it has low electron mobility (approximately 1450 $cm^2$/V-s), which produces a high source resistance. This resistance seriously degrades the high performance gain otherwise possible from Si based HEMTs. [CRC Press, *The Electrical Engineering Handbook*, Second Edition, Dorf, p.994, (1997)]

GaAs is also a common material for use in HEMTs and has become the standard for signal amplification in civil and military radar, handset cellular, and satellite communications. GaAs has a higher electron mobility (approximately 6000 $cm^2$/V-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power.

Improvements in the manufacturing of Group-III nitride based semiconductor materials such as gallium nitride (GaN) and aluminum gallium nitride (AlGaN) has focused interest on the development of AlGaN/GaN based devices such as HEMTs. These devices can generate large amounts of power because of their unique combination of material characteristics including high breakdown fields, wide bandgaps (3.36 eV for GaN at room temperature), large conduction band offset, and high saturated electron drift velocity. The same size AlGaN/GaN amplifier can produce up to ten times the power of a GaAs amplifier operating at the same frequency.

U.S. Pat. No. 5,192,987 to Khan et al. discloses AlGaN/GaN based HEMTs grown on a buffer and a substrate, and a method for producing a HEMT. Other HEMTs have been described by Gaska et al., "High-Temperature Performance of AlGaN/GaN HFET's on SiC Substrates," *IEEE Electron Device Letters*, Vol. 18, No 10, October 1997, Page 492; and Wu et al. "High Al-content AlGaN/GaN HEMTs With Very High Performance", *IEDM*-1999 Digest pp. 925–927, Washington D.C., December 1999. Some of these devices have shown a gain-bandwidth product ($f_T$) as high as 100 gigahertz (Lu et al. "AlGaN/GaN HEMTs on SiC With Over 100 GHz $f_t$ and Low Microwave Noise", *IEEE Transactions on Electron Devices*, Vol. 48, No. 3, March 2001, pp. 581–585) and high power densities up to 10 W/mm at X-band (Wu et al., "Bias-dependent Performance of High-Power AlGaN/GaN HEMTs", *IEDM*-2001, Washington D.C., Dec. 2–6, 2001)

Group-III nitride based semiconductor devices are often fabricated either on sapphire or SiC substrates. One disadvantage of sapphire substrates is that they have poor thermal conductivity and the total power output of devices formed on sapphire substrates can be limited by the substrate's thermal dissipation. Sapphire substrates are also difficult to etch. SiC substrates have higher thermal conductivity (3.5–4 w/cmk) but have the disadvantages of being expensive and not available in large wafer diameters. Typical semi-insulating SiC wafers are two inches in diameter and if the active layers of a transistor are formed on the wafer along with the passive components, interconnections, and/or pre-stage amplifiers, the yield in number of devices per wafer is relatively low. This reduced yield adds to the cost of fabricating Group III transistors on SiC substrates.

Galluim arsenide (GaAs) and silicon (Si) semi-insulating wafers are available in larger diameters at a relatively low cost compared to the smaller diameter SiC wafers. GaAs and Si wafers are easier to etch and have low electrical conductivity. Another advantage of these wafers is that deposition of semiconductor devices and other processing can be conducted at a commercial foundry, which can reduce cost. One disadvantage of these wafers is that they cannot be easily used as a substrate for Group-III nitride based devices because the lattice mismatch between the materials leads to poor quality semiconductor devices. Another disadvantage of these wafers is that they have low thermal conductivity.

SUMMARY OF THE INVENTION

The present invention provides an integrated circuit and a method of fabricating an integrated circuit that uses higher cost, smaller diameter wafers in combination with lower cost, larger diameter wafers to produce lower cost integrated circuits at a higher yield. The active semiconductor devices and terminals are formed on a wafer that is higher cost and not available in larger diameters. To avoid consuming space on the higher cost wafer, the passive components, pre-stage amplifiers, and/or interconnects, are formed on a wafer of lower cost that is available in larger diameters. The active semiconductor devices are then flip-chip mounted in connection with the components on the lower cost, larger diameter wafers.

One method of fabricating an integrated circuit according to the present invention comprises forming a plurality of active semiconductor devices on a wafer, each of said semiconductor devices comprising at least two layers of semiconductor material with terminals electrically contacting the layers. Bonding pads are formed on at least one of the terminals on each of the wafer's active semiconductor devices and the active semiconductor devices are separated. Passive components and interconnections are then formed on a surface of a circuit substrate and at least one conductive via is formed through the circuit substrate. At least one of the active semiconductor devices is flip chip mounted on the circuit substrate with at least one of the bonding pads in electrical contact with one of the conductive vias.

One embodiment of a flip-chip integrated circuit according to the present invention comprises a circuit substrate having passive components and interconnections on one surface with at least one conductive via through the circuit substrate. An active semiconductor device is included which has a substrate with layers of semiconductor material and at least one terminal formed on it. At least one terminal is included in electrical contact with at least one of the layers. The active semiconductor device is flip-chip mounted on the circuit substrate with one of the at least one vias in contact with one of the at least one terminals.

The present invention is particularly applicable to Group III nitride based active semiconductor devices grown on a SiC substrate, and then separated into individual devices. The passive components, pre-stage amplifiers and interconnects can then be formed on a lower cost, higher diameter wafer made of GaAs or Si, or can be formed on other electrically insulating substrates. After separation, one or more of the Group III devices can be flip-chip mounted on the GaAs or Si substrate.

These and other further features and advantages of the invention would be apparent to those skilled in the art from the following detailed description, taking together with the accompanying drawings, in which:

DETAILED DESCRIPTION OF THE INVENTION

Method of Fabrication

Figure 1:
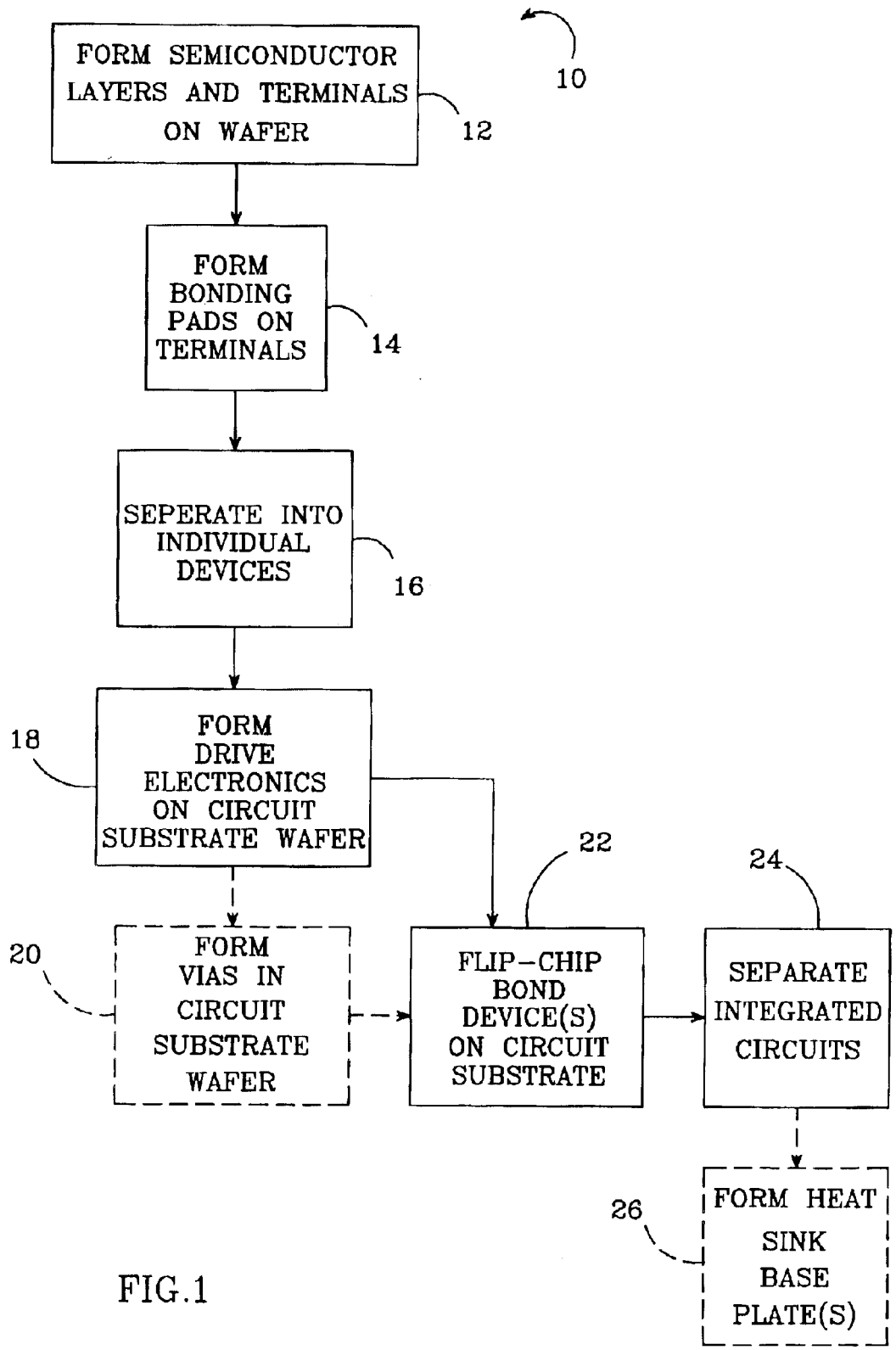
FIG. 1 is a flow diagram for a method of fabricating an integrated circuit according to the present invention.

FIG. 1 shows one embodiment of a method 10 according to the present invention. In the first step 12, semiconductor layers of a semiconductor device and device terminals are formed on a wafer. A preferred semiconductor device is a Group III nitride based device such as an AlGaN HEMT or FET grown on a sapphire, SiC, or Si wafer, with the preferred wafer being a 4H polytype of SiC. Other SiC polytypes can also be used including 3C, 6H and 15R polytypes. An $Al_xGa_{1-x}N$ buffer layer (where x in between 0 and 1) can be included between the wafer and device active layers to provide an appropriate crystal structure transition between the SiC wafer (substrate) and the active layers.

Generally, SiC wafers are preferred over sapphire and Si because they have a much closer crystal lattice match to Group III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree Inc., of Durham, N.C. and methods for producing them are set forth in the scientific literature as well as in a U.S. Pat. Nos. Re. 34,861; 4,946,547; and 5,200,022.

The $Al_xGa_{1-x}N$ and other epitaxial layers can be deposited on the wafer using different epitaxial growth methods such as metalorganic chemical vapor deposition (MOCVD), plasma chemical vapor deposition (CVD) or hot-filament CVD. After the active layers are deposited, portions of the layers can be removed to form locations for the terminals. Different removal methods can be used including but not limited to wet chemical hydrofluoric acid (HF) etching, reactive ion etching (RIE), or plasma etching. The terminals can be deposited on the active layers using sputtering, evaporation or plating.

For a HEMT, the terminals include source and drain contacts that preferably comprise alloys of titanium, aluminum, nickel and gold, and a gate contact that preferably comprises titanium, platinum, chromium, nickel, alloys of titanium and tungsten, and platinum silicide. In one embodiment, the contacts comprise an alloy of nickel, silicon, and titanium that are formed by depositing respective layers of these materials, and then annealing them. Because this alloy system eliminates aluminum, it avoids unwanted aluminum contamination over the device surface when the annealing temperature exceeds the melting point of aluminum (660 degrees C.).

In step 14, bonding pads are formed on at least one of the device's terminals and the bond will contact the circuit substrate when the device is flip-chip mounted as described below. During operation of an AlGaN HEMT the drain contact is biased at a specified potential (positive drain potential for an n-channel device) and the source is grounded. For HEMTs, the bond pad is included on the source contact so it can be electrically connected to ground on the circuit substrate. The bonding pads are preferably made of a highly conductive material such as gold (Au) and they can be deposited using sputtering. Other materials can be used such as a solder bonding pad.

In step 16 the active semiconductor devices on the wafer are separated into individual devices, preferably by dicing. Alternatively the devices can be separated by a scribe and break.

In step 18 drive electronics for driving one or more of the active semiconductor devices are formed on a circuit substrate wafer. The circuit substrate should be low cost, available in large diameters, easy to process, have low electrical conductivity and high thermal conductivity. GaAs and Si are suitable materials for the circuit substrate and have all of the desired characteristics except high thermal conductivity. The thermal conductivity of these materials can be improved by using conductive vias as described below. The drive electronics can comprise pre-stage amplifiers, passive components and interconnections in different combinations. The drive electronics form drive circuits for the flip-chip mounted active semiconductor devices. In embodiments including pre-stage amplifiers, the amplifiers are typically interconnected in series to amplify lower signals. After the pre-stage amplifiers amplify the signal, it can be applied to the flip-chip mounted semiconductor device for high power amplification. Pre-stage amplifiers are not needed in embodiments where the flip-chip mounted device can be driven by passive components and interconnects without pre-stage amplification. The pre-stage amplifiers, passive components and interconnects can be deposited on the circuit substrate using a commercial foundry process, which helps reduce manufacturing costs.

A different number of active devices can be driven by the drive electronics. In one embodiment, a single drive electronics circuit can drive a single active device. In other embodiments, a drive circuit can drive more than one active device or one active device can be driven by more than one drive electronics circuit.

The passive components can include, but are not limited to, resisters, capacitors and inductors, and the interconnections can comprise traces of conductive material or transmission line network elements on the circuit substrate. The pre-stage amplifiers and passive components can be formed using MOCVD, CVD or hot-filament CVD, and the traces can be formed using sputtering or electron beam deposition.

In alternative step 20, one or more conductive vias are formed through the circuit substrate, with each of the drive circuits utilizing at least one conductive vias. In one embodiment according to the invention, the vias form a conductive path to ground for an active semiconductor device that is flip-chip mounted to one of the drive circuits as described below and they also promote the device's heat dissipation. Different methods can be used for forming the vias including but not limited to forming a hole through the circuit substrate using wet chemical HF etching, RIE, ICP or plasma etching. The inside surface of the vias can then be covered with a layer of conductive material, preferably gold (Au), which can be deposited using sputtering. In still another embodiment, the top of the conductive vias can include a plug of conductive material to enhance heat dissipation.

In another embodiment of a method according to the present invention, the circuit substrate for active flip-chip devices can operate without the path through the substrate and as a result, the device does not include conductive vias or plug. The device can be connected to ground through other paths, such as through interconnects on the circuit substrate, and heat can be extracted from the device in other ways, such as through a heat sink attached to the back of the device.

In step 22, the active semiconductor device is flip-chip mounted on the circuit substrate having the Au bond pad in electrical contact with the Au in the vias, in an Au—Au flip chip bond. Alternatively, convention bump bonding based on AU or solder can be used. For an AlGaN HEMT, the Au bond on the source contact is in electrical contact with the vias. The gate and drain contacts can then be electrically bonded to the drive electronics on the circuit substrate, with the gate typically connected to the input side and the drain connected to the output side of the drive electronics.

In step 24 the drive electronic circuits and active devices on the circuit substrate are separated into individual integrated circuits. This can be accomplished by the same methods described above that are used to separate the active devices.

In another alternative step 26, one or more heat sink base plates can be formed on the integrated circuit (before or after being separated), with the base plates then being connected to one or more heat sinks. Heat from the active device and circuit substrate flows into the base plates and then into the heat sink, where it dissipates. The base plates can be arranged in many different ways, including but not limited to, adjacent to the active device and/or the circuit substrate.

Methods according to the present invention can be used to fabricate many different devices beyond AlGaN HEMTs. The different steps of the methods can also be accomplished using different processes and the steps of the methods can be taken in different order.

Flip-Chip Device

Figure 2:
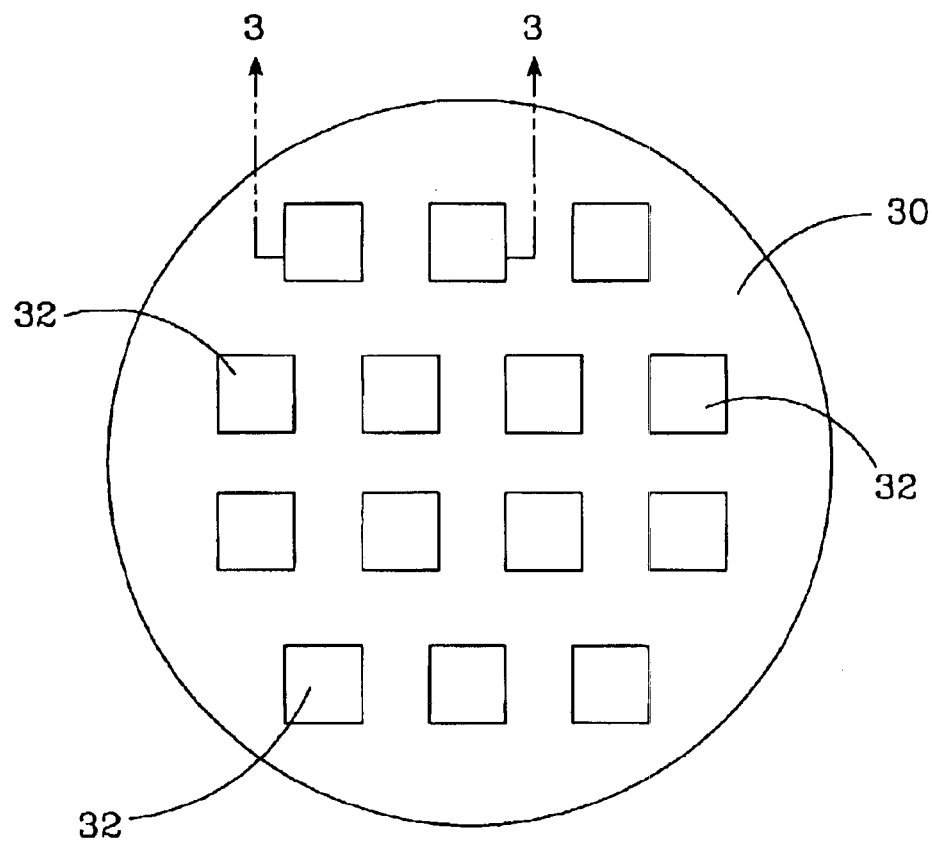
FIG. 2 is a plan view of a SiC wafer according to the present invention, with AlGaN/GaN HEMTS formed on it.

The present invention also discloses an active semiconductor device that is flip-chip mounted on a circuit substrate having passive components and interconnections. FIG. 2 shows a typical semi insulating SiC wafer 30 that is available in different diameters, including approximately two inches. The device active layers and terminals 32, shown as squares on the wafer 30, are deposited on the wafer 30 using the methods described above. The illustration is only a representation of the number of devices that can be formed on a wafer. The preferred device active layers and terminals 32 form an AlGaN HEMT and for a typical 2-inch wafer with 10-Watt HEMTS, approximately 2000 HEMTs can be formed on the wafer. If the passive components or pre-stage amplifiers were formed on the wafer with the HEMT, only approximately 200 devices could be formed.

Figure 3:
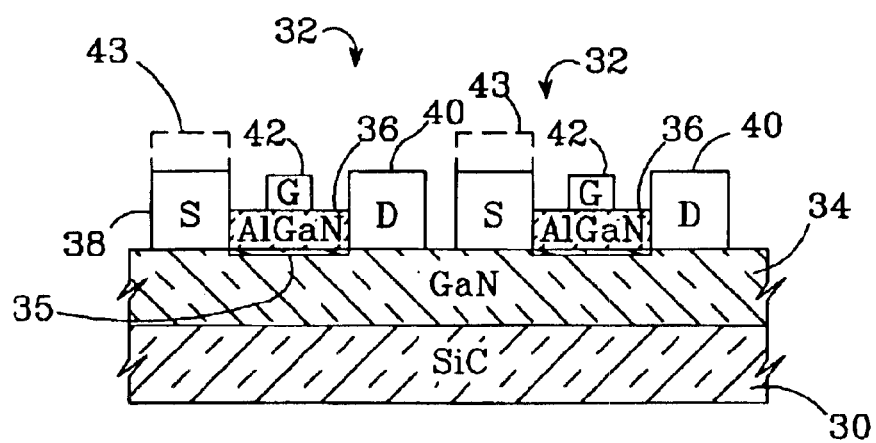
FIG. 3 is a sectional view of two of the AlGaN/GaN HEMTs formed on the wafer shown in FIG. 2.

FIG. 3 shows a sectional view of two of the AlGaN/GaN based HEMTs 32 formed on the wafer 30 according to the present invention. When the HEMTs 32 are separated into individual devices, the portions of the wafer 30 that remain with each HEMT serve as the HEMT's substrate. An $Al_xGa_{1-x}N$ buffer layer (where x in between 0 and 1) (not shown) can be included between the wafer and device active layers to provide the desired crystal structure transition between the wafer and the active layers.

A GaN high resistivity layer 34 is deposited on the wafer 30 and a AlGaN barrier layer 36 is deposited on the high resistivity layer 34. The high resistivity layer 34 is typically about 0.5 to 4 micrometers thick and the barrier layer 36 is typically about 0.1 to 0.3 micrometers thick.

To provide separation between the individual HEMTS and to provide a location for the source and drain contacts 38, 40, the barrier layer 36 is etched to the high resistivity layer 34. The source and drain contacts 38, 40 are deposited on the surface of the high resistivity layer 34 with the barrier layer 36 disposed between them. Each of the contacts 38, 40 are in electrical contact with the edge of the barrier layer 36.

The contacts 38, 40 are usually separated by a distance in the range 1.5 to 5 micrometers for microwave devices, but could be 1 to 10 micrometers in special cases. A rectifying Schottky contact (gate) 42 is located on the surface of the barrier layer 36 between the source and drain contacts 38, 40, and it typically has a length in the range of 0.1 to 2 micrometers. The total width of the HEMT 32 depends on the total power required. It can be wider than 30 millimeters, with the typical width being in the range of 100 microns to 6 millimeters.

The barrier layer 36 has a wider bandgap than the GaN layer 34 and this discontinuity in energy band gaps results in a free charge transfer from the wider band gap to the lower band gap material. Furthermore, in the Group III-Nitride system, piezoelectric and spontaneous polarization results in a significantly higher charge density. A charge accumulates at the interface between the two layers and creates a two dimensional electron gas (2DEG) 35 that allows current to flow between the source and drain contacts 38, 40. The 2DEG 35 has very high electron mobility which gives the HEMT a very high transconductance.

During operation, the drain contact 40 is biased at a specified potential (positive drain potential for an n-channel device) and the source is grounded. This causes current to flow through the channel and 2DEG, from the drain to the source contacts 38, 40. The flow of current is controlled by the bias and frequency potentials applied to the gate 42, which modulate the channel current and provide gain. The voltage applied to the gate 42 electrostatically controls the number of electrons in the 2DEG directly under the gate 42, and thus controls the total electron flow.

Figure 4:
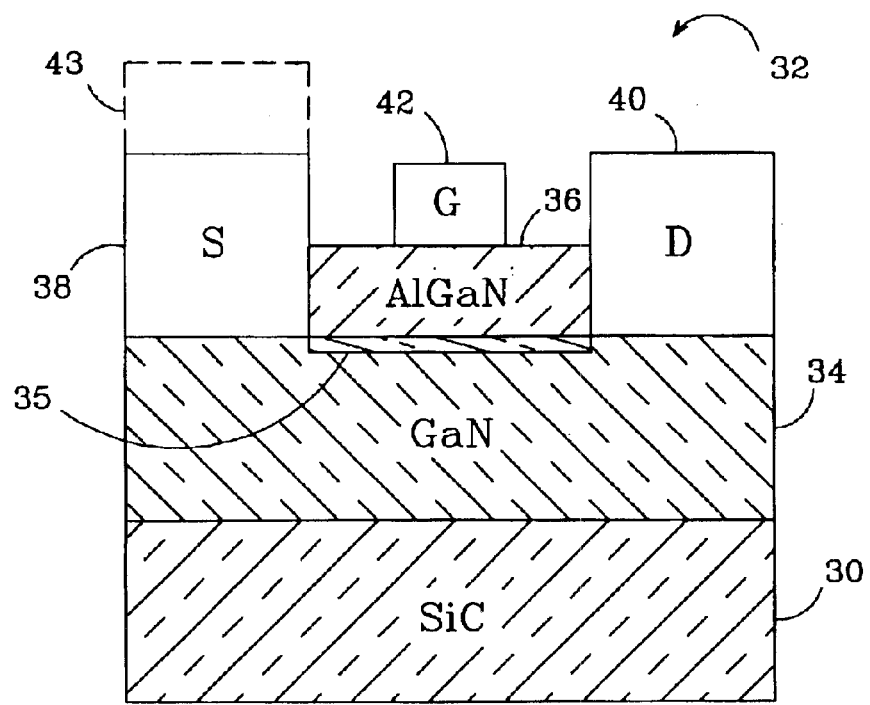
FIG. 4, is a sectional of an individual HEMT separated from the other HEMTs on the wafer of FIG. 2.

A bonding pad 43 is also included on the source contact 38 for flip-chip bonding to the circuit substrate as described below. When the HEMTs 32 on the wafer 30 are separated into individual HEMTs, portions of the GaN layer 34 and SiC wafer 30 between the HEMTs are removed leaving individual devices as shown in FIG. 4.

Figure 5:
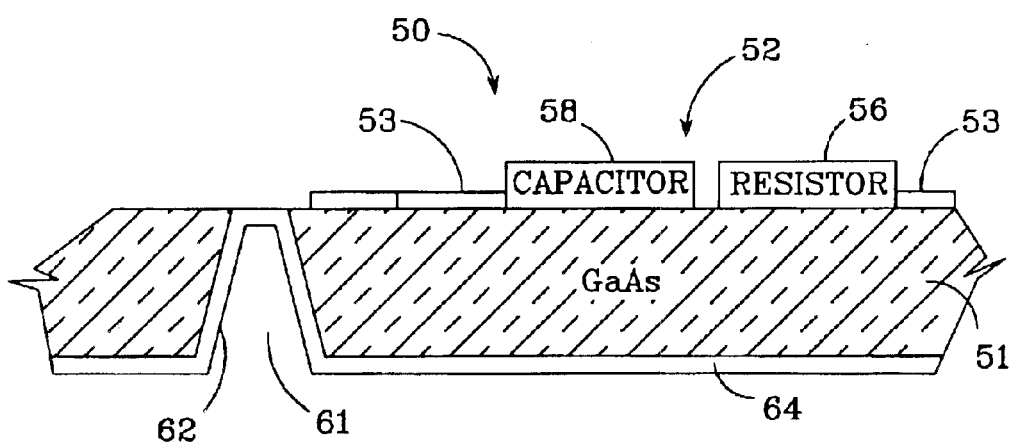
FIG. 5 is a sectional view of a circuit substrate according to the present invention.

FIGS. 5–8 show different embodiments of circuit substrates according to the present invention, although other circuit substrates can also be used. FIG. 5 shows a circuit substrate 50 according to the present invention, which includes a wafer 51 that can be made of many different materials including GaAs. The wafer 51 has passive components 52 and interconnects 53 deposited on its top surface. The wafer 51 can have many different thicknesses, with a suitable thickness being in the range of 50 to 500 micrometers. Wafers of other material can also be used, including Si, with the preferred wafers being easy to process, having low electrical conductivity and/or having high thermal conductivity.

Different passive components can be used including resistors 56 or capacitors 58, and the interconnects 53 can be conductive traces 60. The passive components 52 and the interconnects 53 together serve as the drive electronics and matching circuit for an active device that is flip-chip mounted on substrate 50 (as described below). The substrate 50 can have drive electronics for more than one active device and the passive components 52 and traces can be formed using the methods as described above in the method of FIG. 1.

A hole 61 is formed through the GaAs wafer 51, and the inside surface and top opening of the hole 61 is covered with a hole layer 62 of material having high electrical and thermal conductivity. The layer 62 forms a conductive via 63 through the wafer 51. The bottom surface of the wafer 51 can also be covered with a layer of material 64 having high electrical and thermal conductivity, with the preferred material for the layers 62 and 64 being Au. Electricity and heat pass through the layer 62 and are spread into layer 64. The layers 62 and 64 together serve as the electrical contact to ground for a device that is flip-chip mounted on the substrate 50 and they also help dissipate heat from the flip-chip mounted device. This is particularly useful for GaAs and Si substrates that have relatively low thermal conductivity. Generally, the larger the vias 62 the more efficient the circuit substrate 50 at dissipating heat. Typical vias are 50–100 microns wide, but wider or narrower vias can be used.

Figure 6:
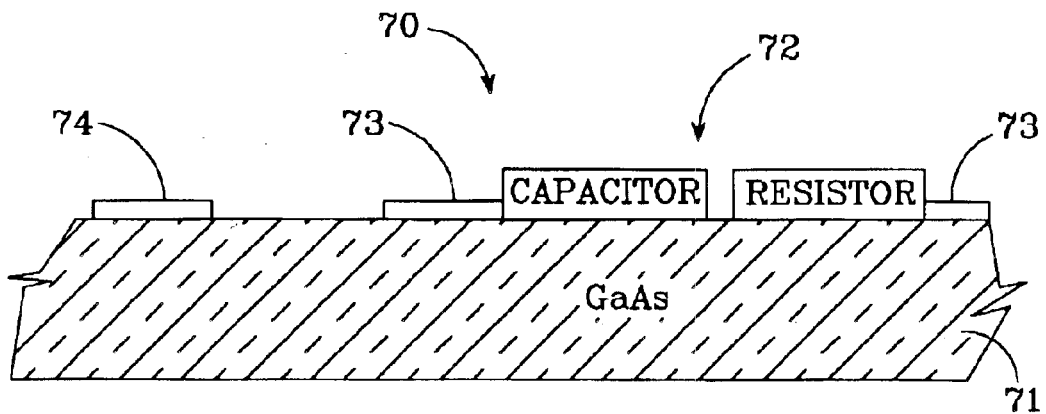
FIG. 6 is a sectional view of a second circuit substrate according to the present invention.

FIG. 6 shows a circuit substrate 70 according to the present invention, which includes a GaAs wafer 71 that is similar to the wafer 51 in FIG. 5, and can be made of the same materials. The wafer 71 has passive components 72 and interconnects 73 deposited on its top surface to form drive electronics. However, the wafer 71 does not have a hole, a conductive via or a conductive layer on its bottom surface. Instead, to provide a conductive path to ground a conductive trace 74 is included on the surface of the wafer 71. Devices can be flip chip mounted on the wafer 71 with the device ground connection to the trace 74, such that a conductive path through the wafer 71 for ground or heat dissipation is not needed.

Figure 7:
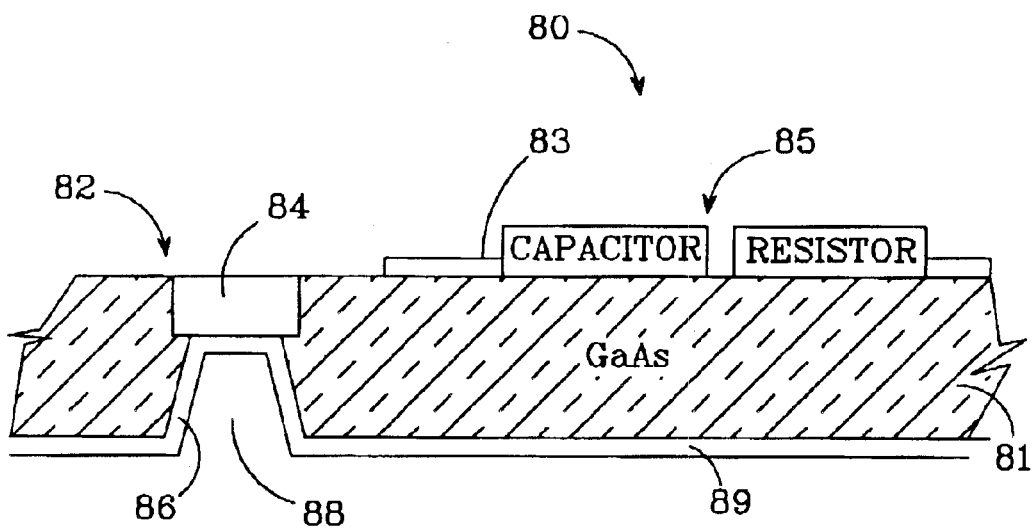
FIG. 7 is a sectional view of a third circuit substrate according to the present invention.

FIG. 7 shows a circuit substrate 80 according to the present invention that is similar to the circuit substrate 50. It includes a wafer 81 and a conductive vias 82 formed in the hole 88. However, in substrate 80 a plug 84 of material with high electrical and thermal conductivity is included. The plug 84 is at the top of the hole 88, with the plugs top surface at the top surface of the wafer 81. The vias layer 86 covers the inside of the hole 88 and the bottom surface of the plug 84. The plug 84 is preferably made of gold (Au) and allows the substrate 80 to more efficiently conduct heat away from the flip-chip device mounted on it. The substrate 80 also includes passive components 85, interconnects 83, and bottom conductive layer 89.

Figure 8:
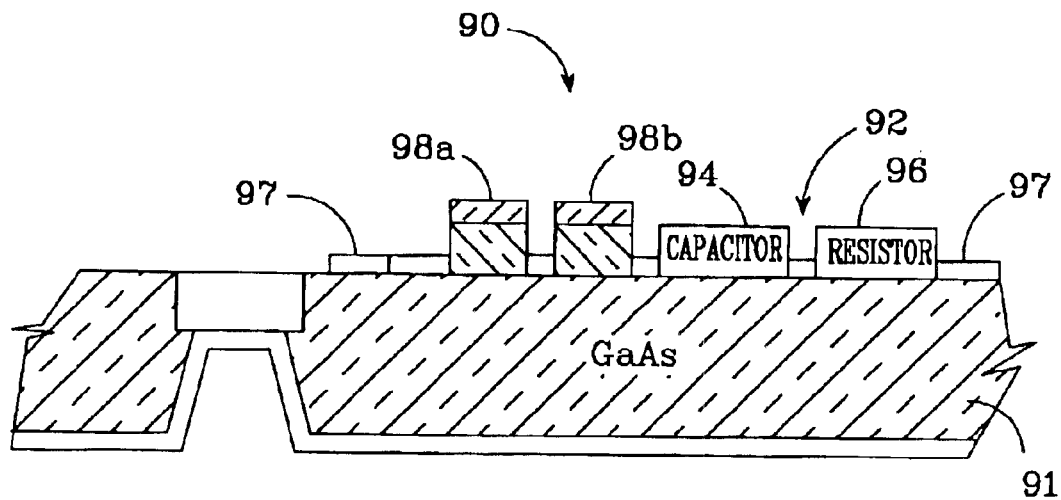
FIG. 8 is a sectional view of a fourth circuit substrate according to the present invention.

FIG. 8 shows another embodiment of a circuit substrate 90 according to the present invention that includes a wafer 91, and passive components 92 that can include but are not limited to a capacitor 94, resistor 96 and interconnects 97. In addition, the substrate 90 has pre-stage amplifiers 98a and 98b that can be made of many material systems including InGaAs and InP. The amplifiers 98a, 98b serve as pre-stages of amplification are typically connected in series to amplify lower signals. After the pre-stage amplifiers 98a, 98b amplify the signal, it is applied to the amplifier flip-chip mounted on the substrate 90, for high power amplification. The pre-stage amplifiers are preferably HEMTs and 2–3 pre-stage amplifiers are typically used, although more or less could also be used. As outlined above, the pre-stage amplifiers 98a, 98b can be fabricated on the circuit substrate 91 along with the passive components 92 using a commercial foundry.

A circuit substrate according to the present invention can have any combination of the substrate features shown in FIGS. 5-8. For instance, the substrate can have pre-stage amplifiers without a vias, or if the substrate has a vias, the vias can be used without a plug. Accordingly, there are many additional embodiments of the circuit substrate according to the present invention beyond those described above.

Figure 9:
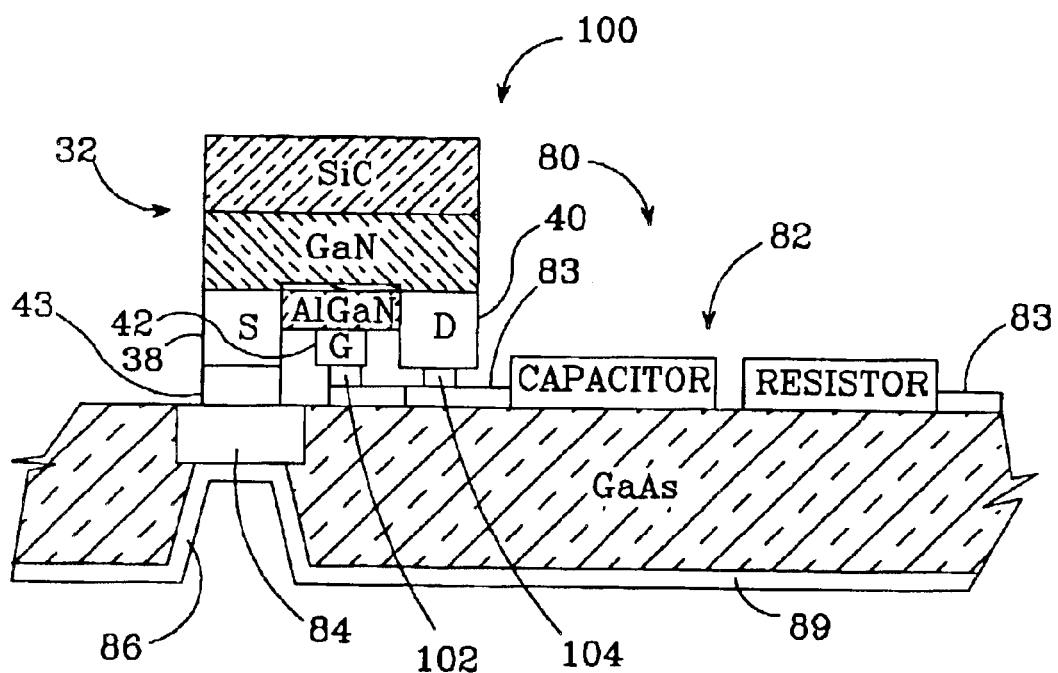
FIG. 9 is a sectional view of an integrated circuit according to the present invention with the circuit substrate having a HEMT flip-chip mounted to it.

FIG. 9 shows a flip-chip integrated circuit (IC) assembly 100 according to the present invention, having the HEMT 32 of FIG. 4 flip-chip mounted on the circuit substrate 80 of FIG. 7, although the HEMT 32 can also be flip-chip mounted on the circuit substrates 50, 70 and 90 in FIGS. 5, 6 and 8. The same reference numerals from FIGS. 4 and 7 are used for the same features.

The HEMT's bonding pad 43 on the source contact 38 is bonded to the surface of the circuit substrate 80 with the bonding pad 43 over the plug 84. The bonding pad 43 is bonded in electrical and thermal contact with the plug 84. The layer 89 serves as the integrated circuit's ground and the source contact 38 is connected to layer 89 through the plug 84 and via layer 86. Heat also flows to the layer 89 from the HEMT 32 through the plug 84 and via layer 86. The drain 40 and gate 42 are connected to the passive components 82 through conductive connections 102, 104 and interconnects 83 on the circuit substrate 80. By flip-chip mounting as shown in FIG. 9, integrated circuits 100 can be manufactured at lower cost with higher yield.

Figure 10:
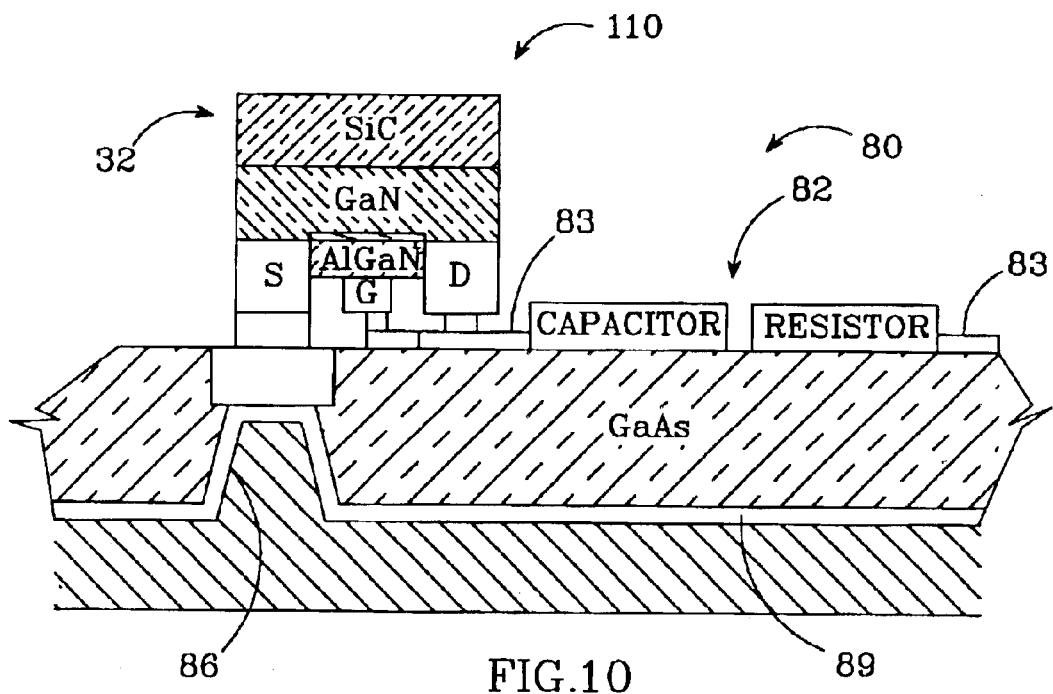
FIG. 10 is a sectional view of the device in FIG. 8 with a first heat sink root on the bottom surface of the circuit substrate.

FIG. 10 shows an IC assembly 110 that is similar to the integrated circuit 100 in FIG. 9, but has improved heat dissipation characteristics. It has the same HEMT device 32 that is flip-chip mounted to a circuit substrate 80 having passive components 82 and interconnects 83. A first heat sink base plate 114 is disposed adjacent to the conductive layers 86 and 89, with heat from the layers flowing into the first base plate 114. Heat from the first base plate 114 then flows into an external heat sink (not shown) where it is dissipated. The base plate 114 and heat sink should be made of a thermally conductive material that conducts heat away from the substrate 80 and the HEMT 32, with suitable materials being Cu, Cu—W, Cu—Mo—Cu composites, AlN, diamond or other conventional heat sink materials. The base plate 114 and heat sink help keep the HEMT 32 from overheating at higher power levels. The base plate 114 can also be used with a circuit substrate that does not have a conductive plug.

Figure 11:
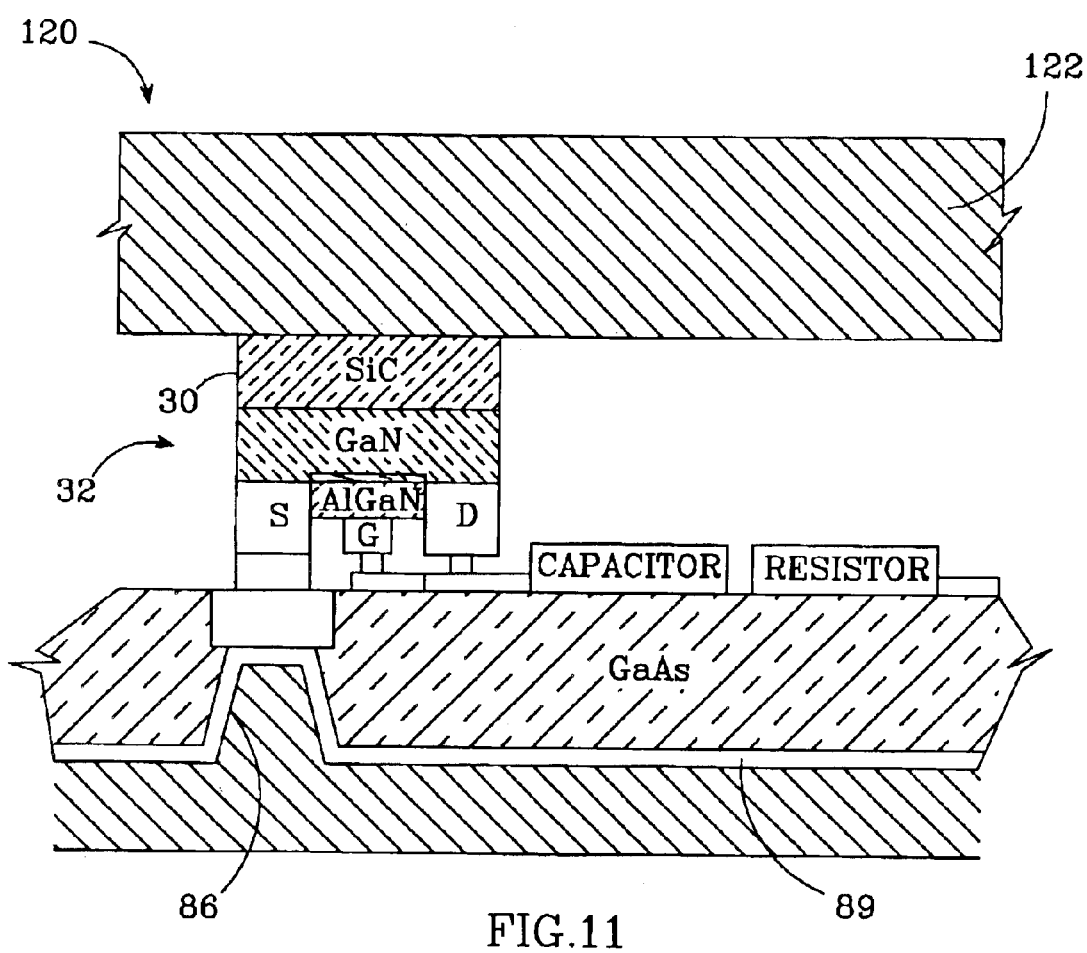
FIG. 11 is a sectional view of the device in FIG. 9 with a second heat sink root adjacent to the substrate of the HEMT.

FIG. 11 shows another IC assembly 120 according to the present invention that is similar to the IC assembly 110 in FIG. 110, but includes additional heat dissipation features. The IC assembly 120 has a HEMT 32 flip-chip mounted on a circuit substrate 80 that has the same first base plate 114 as the circuit 110 in FIG. 10. To improve heat dissipation through the HEMT's substrate 30, the IC assembly 120 also has a second heat sink base plate 122 arranged adjacent to the SiC substrate 30. The second base plate 122 is coupled to a second heat sink (not shown), which provides another path for heat from the HEMT 32 to dissipate. The second base plate 122 and second heat sick can be made of the same or different materials as the first base plate 114 and heat sink, but should be made of a heat conductive material. The second base plate 122 can also be used with a HEMT that is flip-chip mounted on circuit substrates that does not have a plug 84. It can also be used in an IC assembly that does not have a first heat sink, although the most efficient heat dissipation is provided by using first and second base plates 114, 122 with their respective heat sinks. In other embodiments of the invention, the second base plate 122 can be the primary path for heat dissipation and/or the first base plate 114 can be simplified or omitted. To compensate for thermal expansion of the IC assembly 120, the first or second base plates 114, 122 can be connected to a thermally conductive encapsulation instead of a heat sink, with the encapsulation being somewhat resilient or flexible.

Figure 12:
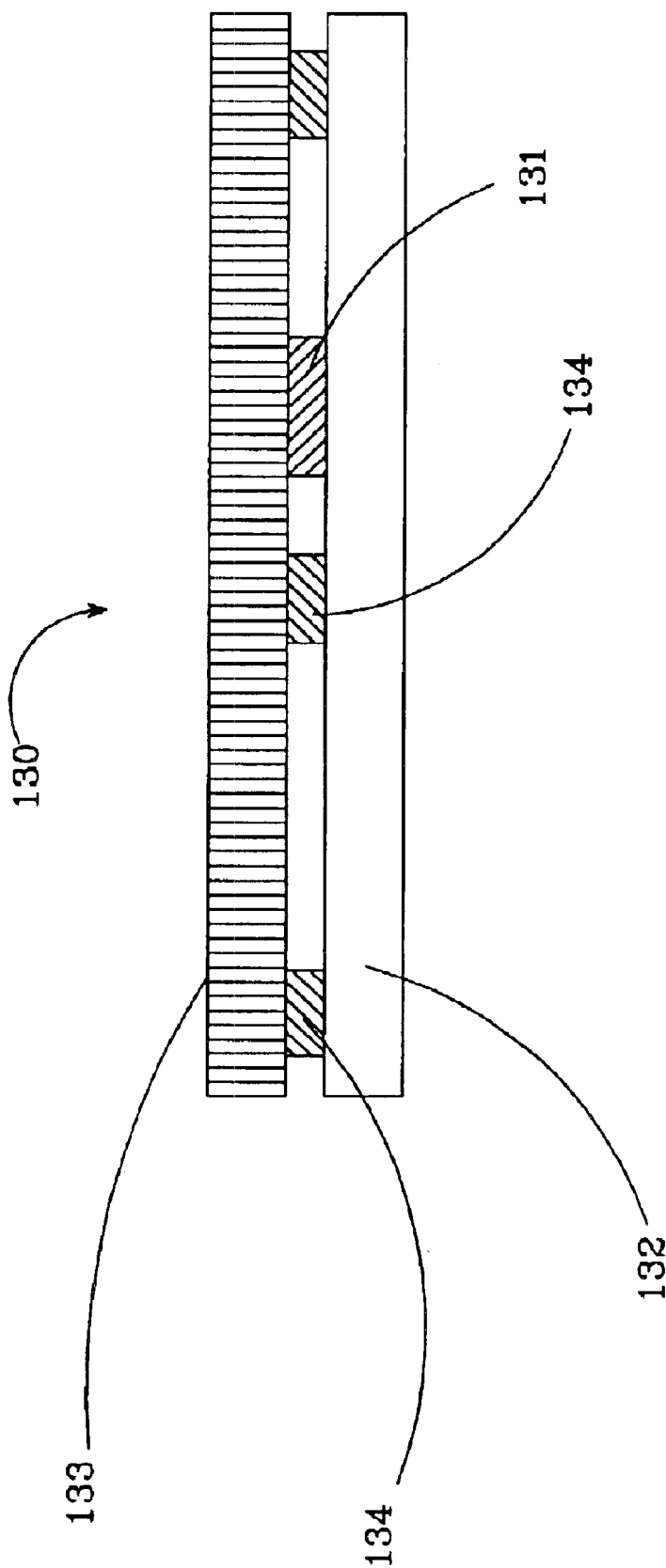
FIG. 12 is a sectional view of another integrated circuit according to the present invention with a flip-chip mounted HEMT and second heat sink root.

FIG. 12 shows an IC assembly 130 according to the present invention having a flip-chip mounted GaN HEMT 131 mounted on a circuit substrate 132. Passive components, pre-stage amplifiers and interconnects (not shown) can be included on the substrate 132. A top heat sink base plate 133 is included on the HEMT 131, with the base plate 133 also mounted to the substrate 132 by spacers 134 that can be dummy chips or solder bumps. The spacers 134 arrangement holds the heat sink base plate 133 adjacent to the HEMT 131 while providing a stable attachment of the base plate 133 to the substrate 132.

Although the present invention has been described in considerable detail with reference to certain preferred configurations thereof, other versions are possible. The sequence of the steps in the methods described above can be different. Other methods according to the invention can use more or less steps and can use different steps. All embodiments described above can be used with circuit substrates with or without pre-stage amplifiers and with or without via plugs. Many different types of integrated circuits made of many different materials can be flip-chip mounted according to the invention. Therefore, the spirit and scope of the claims should not be limited to the versions on the invention described in the specification.

We claim:

1. A flip-chip integrated circuit, comprising:
   a circuit substrate having drive electronics on one surface;
   an active semiconductor device comprising a substrate with layers of semiconductor material and a plurality of terminals, each of said terminals in electrical contact with one of said layers of semiconductor material, said active semiconductor device flip-chip mounted on said circuit substrate, at least one of said terminals in electrical contact with said drive electronics; and
   at least one conductive vias through said circuit substrate, each of said conductive vias in electrical contact with one of said plurality of terminals.

2. The integrated circuit of claim 1, wherein each of said at least one vias comprises a hole through said circuit substrate, the surface of said hole covered by a first layer of conductive material.

3. The integrated circuit of claim 2, further comprising a second layer of conductive material on the surface of said circuit substrate opposite said drive electronics.

4. The integrated circuit of claim 3, wherein said second layer of conductive material is in electrical and thermal contact with said first layer of conductive material, said second layer of conductive material forming a ground for said vias and dissipating heat from said active semiconductor device.

5. The integrated circuit of claim 1, further comprising at least one heat sink base plate to help dissipate heat from said active semiconductor device and drive electronics.

6. The integrated circuit of claim 5, wherein said at least one heat sink base plate comprises a heat sink base plate arranged adjacent to said substrate.

7. The integrated circuit of claim 1, wherein each of said at least one vias further comprises a plug of conductive material at the top of said via.

8. The integrated circuit of claim 1, wherein said drive electronics comprise passive components and interconnects.

9. The integrated circuit of claim 1, wherein said drive electronics comprise pre-stage amplifiers and interconnects.

10. The integrated circuit of claim 7, further comprising a conductive bonding pad between each of said at least one terminal and vias that are in electrical contact.

11. A flip-chip integrated circuit, comprising:
    a circuit substrate having drive electronics on one surface;
    an active semiconductor device comprising a substrate with layers of semiconductor material and a plurality of terminals, each of said terminals in electrical contact with one of said layers of semiconductor material, said active semiconductor device flip-chip mounted on said circuit substrate, at least one of said terminals in electrical contact with said drive electronics;
    a second layer of conductive material on the surface of said circuit substrate opposite said drive electronics; and
    at least one heat sink base plate to help dissipate heat from said active semiconductor device and drive electronics, wherein said at least one heat sink base plate comprises a heat sink base plate arranged adjacent to said second conductive layer.

12. The integrated circuit of claim 11, wherein said layers of semiconductor material are Group III nitride based materials and said substrate is sapphire or silicon carbide.

13. A flip-chip integrated circuit, comprising:
a high electron mobility transistor (HEMT) comprising;
a substrate;
a high resistivity semiconductor layer on said substrate;
a barrier semiconductor layer on said high resistivity layer, said barrier layer having a wider bandgap than said high resistivity layer;
a two-dimensional electron gas between said barrier layer and said high resistivity layer;
respective source and drain contacts on said high resistivity layer and contacting said barrier layer;
a gate contact on said barrier semiconductor layer; and
a circuit substrate comprising drive electronics on one surface and a conductive vias, said HEMT flip-chip mounted on said circuit substrate with said source contact in electrical contact with said conductive vias, and said gate and drain contacts in electrical contact with said drive electronics.

14. The integrated circuit of claim 13, wherein said high resistivity semiconductor layer and said barrier semiconductor layer are made of a Group III nitride semiconductor material.

15. The integrated circuit of claim 13, wherein said substrate is made of a material from the group consisting of sapphire and silicon carbide.

16. The integrated circuit of claim 13, further comprising a layer of conductive material on the surface of said circuit substrate opposite said passive components, said layer of conductive material in electric and thermal contact with said vias.

17. The integrated circuit of claim 13, further comprising one or more heat sink base plates to dissipate heat from said HEMT and said passive components.

18. The integrated circuit of claim 13, wherein said drive electronics comprise pre-stage amplifiers and integrated circuits.

* * * * *

UNITED STATES PATENT AND TRADEMARK OFFICE
CERTIFICATE OF CORRECTION

PATENT NO. : 6,825,559 B2  Page 1 of 1
APPLICATION NO. : 10/335915
DATED : November 30, 2004
INVENTOR(S) : Umesh K. Mishra, Primit Parikh and Yifeng Wu It is certified that error appears in the above-identified patent and that said Letters Patent is hereby corrected as shown below:

Title Page; item (54);
On page 1, column 1, in the title of the patent, delete "INTERGRATED", and insert --INTEGRATED--.

Signed and Sealed this

Twenty-fifth Day of December, 2007

JON W. DUDAS
*Director of the United States Patent and Trademark Office*